(12) United States Patent
Raghunathan et al.

(10) Patent No.: US 6,735,744 B2
(45) Date of Patent: May 11, 2004

(54) POWER MODE BASED MACRO-MODELS FOR POWER ESTIMATION OF ELECTRONIC CIRCUITS

(75) Inventors: Anand Raghunathan, Princeton, NJ (US); Ganesh Lakshminarayana, Princeton, NJ (US); Nachiketh Potlapally, Princeton, NJ (US); Michael S. Hsiao, Princeton, NJ (US); Srimat T. Chakradhar, Princeton, NJ (US)

(73) Assignee: NEC Corporation, Tokyo (JP)

( * ) Notice: Subject to any disclaimer, the term of this patent is extended or adjusted under 35 U.S.C. 154(b) by 119 days.

(21) Appl. No.: 10/013,496

(22) Filed: Dec. 13, 2001

(65) Prior Publication Data

US 2002/0133792 A1 Sep. 19, 2002

Related U.S. Application Data

(60) Provisional application No. 60/266,859, filed on Feb. 7, 2001.

(51) Int. Cl.[7] ............................................. G06F 17/50
(52) U.S. Cl. ................................. 716/4; 716/1; 703/18
(58) Field of Search ......................... 716/1–18; 703/18; 702/60–63; 700/291–298

(56) References Cited

U.S. PATENT DOCUMENTS

| | | | | |
|---|---|---|---|---|
| 6,075,932 A | * | 6/2000 | Khouja et al. | 395/500.05 |
| 6,151,568 A | * | 11/2000 | Allen et al. | 703/14 |
| 6,321,185 B1 | * | 11/2001 | Takahashi | 703/15 |
| 6,363,515 B1 | * | 3/2002 | Rajgopal et al. | 716/5 |
| 2002/0011885 A1 | * | 1/2002 | Ogawa et al. | 327/158 |

* cited by examiner

Primary Examiner—Vuthe Siek
(74) Attorney, Agent, or Firm—Sughrue Mion, PLLC

(57) ABSTRACT

A method of creating models for power estimation of a circuit comprising generating an input space for the circuit. The input space is separated into multiple power modes corresponding to regions that display similar power behavior. Separate power models are generated for each of said multiple power modes. A power mode identification function is created that selects an appropriate power model from the separate power models based on the present and past values of the circuit inputs.

7 Claims, 12 Drawing Sheets

```
LINE SWEEP (Start Threshold $T_{start}$, End Threshold $T_{end}$,
            Step $\Delta$ ) {
    line ← 0;
    flag ← 0;
    num_cluster, start_cluster, end_cluster ← 0;
    structure CLUSTER (num_cluster,start_cluster,end_cluster);
    while (line ≤ 90°) {
        line ← line + $\Delta$ ;
        line_popl ← number of points on the line;
        if (line_popl ≥ $T_{start}$) and (flag = 0) {
            num_cluster ← num_cluster + 1;
            start_cluster ← line;
            flag ← 1;
        }
        if (line_popl ≤ $T_{end}$) {
            end_cluster ← line;
            flag ← 0;
            return CLUSTER;
        }
    }
}
```

FIG. 7

```
STRENGTH CLASSIFICATION (cntrl_cond[1...N],
                        power mode[1...M]) {
  for (j ← 1; j ≤ M; j ← j + 1) {
    num_points_j ← number of points in power mode_j;
    for (k ← 1; k ≤ N; k ← k + 1) {
      count_jk ← 0;
    }
  }
  for (j ← 1; j ≤ M; j ← j + 1) {
    for (k ← 1; k ≤ N; k ← k + 1) {
      while (num_points_j) {
        if (point_j satisfies cntrl_cond_k) {
          ++count_jk;
          --num_points_j;
        }
      }
    }
  }
  for (j ← 1; j ≤ M; j ← j + 1) {
    for (k ← 1; k ≤ N; k ← k + 1) {
      if ((count_jk satisfies Prop 1) and (count_jk satisfies Prop 2)) {
        defn_cond_j ← cntrl_cond_k;
        break;
      }
    }
  }
  residual_conds ← cntrl_conds − defn_conds;
  num_residual ← number of paths in residual_conds;
  for (k ← 1; k ≤ num_residual; k ← k + 1) {
    for (j ← 1; j ≤ M + 1; j ← j + 1) {
      evaluate ACE_kj;
    }
    defn_cond[min(ACE_kj)] ← residual_cond_k;
  }
}
```

FIG. 9

| Circuit | I | O | BW | Components |
|---|---|---|---|---|
| C5 | 2 | 1 | 8 | 2 Latches, Comp, Mux, Sub |
| C6 | 2 | 1 | 8 | 2 Latches, Comp, Mux, Mult |
| C7 | 2 | 1 | 8 | 4 Latches, Comp, Mux, Mult, Add |
| C8 | 2 | 1 | 8 | 4 Latches, Comp, Mux, Mult, And |
| C9 | 2 | 1 | 8 | 4 Latches, Comp, Mux, Add, Or |
| C10 | 2 | 1 | 8 | 4 Latches, Comp, Mux, Or, And |
| C11 | 2 | 1 | 16 | 2 Latches, Comp, Mux, Sub |

FIG. 11

| Circuit | Error(conv) | Error(prop) | Imprv. |
|---|---|---|---|
| C5 | 1.304 | 0.508 | 61.1 % |
| C6 | 4.42 | 0.45 | 90.56 % |
| C7 | 0.82 | 0.389 | 52.5 % |
| C8 | 1.65 | 0.447 | 72.9 % |
| C9 | 0.846 | 0.483 | 42.9 % |
| C10 | 0.77 | 0.56 | 27.7 % |
| C11 | 0.987 | 0.543 | 45 % |

FIG. 12

POWER MODE BASED MACRO-MODELS FOR POWER ESTIMATION OF ELECTRONIC CIRCUITS

I.A. Related Applications

This Application claims priority from now abandoned U.S. Provisional Application Ser. No. 60/266,859, filed Feb. 7, 2001.

I.B. Field

This disclosure teaches novel techniques related to power estimation for circuits. Specifically, cycle-accurate power macro-modeling techniques for complex circuit components are taught. As a specific example, RTL circuits are discussed, though the techniques discussed are equally applicable for all kinds of circuits regardless of their representation.

I.C. Background

1. Introduction

Power dissipation is a mainstream design metric in deep sub-micron system-on-chip technologies. This is due to the signal integrity and power delivery concerns associated with deep sub-micron technologies. The increasing complexity of system chips has led to the adoption of high-level design methodologies in order to bridge the gap between design and productivity. High-level power estimation is critical to supporting power budgeting and tradeoffs when designing the system architecture.

The application of high-level power estimators ranges from simple tasks like relative comparison of alternative circuit designs with respect to their power dissipation, to sophisticated uses like chip-level power grid analysis and design, I-R drop calculation for static timing analysis, and hot-spot sensitive system floor-planning. This increasing importance of power estimation has significantly raised the requirements of the estimation accuracy. Many of the latter mentioned applications require absolute accuracy and cycle-by-cycle power estimates that can be correlated with functional and timing information related to the circuit.

2. References

The following papers provide useful background information, for which they are incorporated herein by reference in their entirety, and are selectively referred to in the remainder of this disclosure by their accompanying reference numbers in square brackets (i.e., [3] for the third numbered paper by J. Monteiro and S. Devdas):

[1] J. Rabaey and M. Pedram, *Low Power Design Methodologies*. Kluwer Academic Publishers, Norwell, Mass., 1996.

[2] A. R. Chandrakasan and R. W. Brodersen, *Low Power Digital CMOS Design*. Kluwer Academic Publishers, Norwell, Mass., 1994.

[3] J. Monteiro and S. Devdas, *Computer-Aided Design Techniques for Low Power Sequential Logic Circuits*. Kluwer Academic Publishers, Norwell, Mass., 1996.

[4] M. Pedram, "Power minimization in IC design: principles and applications," in *ACM Trans. Design Automation Electronic Systems*, vol. 4, no. 1, pp. 3–56, January 1996.

[5] S. Powell and P. Chau, "Estimating power dissipation of VLSI signal processing chips: The PFA techniques," in *Proc. IEEE Workshop on VLSI Signal Processing IV*, vol. IV, pp. 250–259, 1990.

[6] P. Landman and J. Rabaey, "Power estimation for high-level synthesis," in *Proc. European Design Automation Conf.*, pp. 361–366, February 1993.

[7] D. Marculescu, R. Marculescu and M. Pedram, "Information theoretic measures for energy consumption at RTL," in *Proc. Intl, Symp. Low Power Electronics*, pp. 81–86, April 1995.

[8] M. Nemani and F. Najm, "High-level power estimation and area complexity of Boolean applications," in *Proc. Intl. Symp. Low Power Electronics*, pp. 329–334, August 1996.

[9] A. Raghunathan, S. Dey and N. K. Jha, "RTL estimation techniques for switching activity and power consumption:' in *Proc. Intl Conf Computer-Aided Design*, pp. 583–588, November 1996.

[10] L. Benini, A. Bogliolo, M. Favalli, and G. DeMicheli, "Regression models for behavioral power estimation," in *Proc. of Intl. Workshop—Power and Timing, Modeling, Optimization and Simulation*, 1996.

[11] Q. Wu, C. Ding, C. Hsieh and M. Pedram, "Statistical design of macro-models for RT-level power estimation," in *Proc. Asia and South Pacific Design Automation Conf.*, pp. 523–528, January 1997.

[12] Z. Chen, K. Roy and K. P. Chong, "Estimation of power sensitivity in sequential circuits with power macromodeling application:' in Proc. Intl. Conf. Computer-Aided Design, pp. 468–472, 1998.

[13] S. M. Wiess and C. A. Kulikowski, *Computer Systems that Learn*. Morgan Kaufmann 1991.

[14] W. N. Venables and B. D. Ripley, *Modern Applied Statistics with S-PLUS*. Springer-Verlag 1998.

[15] W. N. Venables and B. D. Ripley, Modern Applied Statistics with S-PLUS. Springer-Verlag 1998.

[16] Open CAD V 5 Users Manual. NEC Electronics, Inc. 1997.

[17] CBC9VX Library Manual. NEC Electronics, Inc. 1997.

[18] CYBER Reference Manual. NEC Electronics, Inc. 1997.

3. Related Work

It is well known that power estimation is more accurate in lower-level power estimators, while it is more computationally efficient in higher-level power estimators. Transistor and gate-level power estimation techniques have been well researched [1, 2, 3, 4], and several commercial tools exist that are reasonably mature. While there has also been some research on high-level power estimation techniques [5, 6, 7, 8, 9, 10, 11, 12], their limited accuracy has been one of the major challenges facing their widespread adoption.

High-level power estimators can be classified on the basis of the information they produce (e.g., spatial and temporal resolution of the power report), as well as the techniques employed (e.g., fast synthesis based, analytical, macro-modeling based, etc.). Aggregate estimators are those which, when given a complete set of input vectors or sequences, report the average power dissipated in the circuit when the complete set of vectors are applied. Applications where power dissipation information needs to be correlated with functional or timing information (e.g., peak power constraints, transient hot-spot analysis, and "power debugging"), require power values on a cycle-by-cycle basis.

This disclosure is aimed at teaching a novel technique to address the problem of improving the accuracy of high-level power estimation. The disclosed technique is in the context of a cycle-accurate macro-modeling based power estimation methodology.

In a general sense, macro-modeling is a commonly used technique for high-level power estimation. Macro-modeling techniques formulate the power consumed (dependent variable), in terms of parameters (independent variables) that are easily observable at a high level of abstraction. Some examples of power macro-models are linear or non-linear equations and look-up tables.

The concept of cycle-accurate high-level macro-models was used in [10, 11]. A cycle-accurate macro-model gives the power dissipated in each cycle of operation. That is, given a set of vectors, a cycle-accurate macro-model gives the power dissipated by every vector pair applied to the circuit. If $P_k$ is the power consumed by a module in cycle k, it can be defined as $$P_k = F(V_{k-1}, V_k)$$

where, $V_{k-1}$ and $V_k$ represent the input vectors for the module at cycles k−1 and k respectively. Note that the above equation can be extended to account for the dependence of power consumption on any finite history of input values. In practice, the power dissipation of atomic RTL components (functional units, multiplexers/buses, and latches/registers) is amenable to being modeled by the above equation, and more complex blocks can be decomposed into these atomic components for power estimation. The function F is referred to as the macro-model. It is parameterized with respect to some variables, which can be derived from the input vector pair. The goal of power macro-modeling (or characterization) is to derive F itself. The inputs to the macro-modeling procedure are a set of characterization vectors and the corresponding cycle-by-cycle power consumption values (derived using an accurate lower-level power estimator on a gate- or transistor-level implementation). With minimal additional effort, cycle-accurate macro-models can also provide the average power dissipated (akin to the behavior of aggregate estimators).
This Application is related to co-pending U.S. application Ser. No. 09/771100, titled "Multi-Level Power Macromodeling".

The disclosed teaching can be considered to be an improvement over conventional macro-modeling techniques.

II. SUMMARY

According to an aspect of the disclosed techniques, there is provided a method of creating models for power estimation of a circuit comprising generating an input space for the circuit; separating the input space into multiple power modes corresponding to regions that display similar power behavior; generating separate power models for each of said multiple power modes; and creating a power mode identification function that selects an appropriate power model from the separate power models based on the present and past values of the circuit inputs.

In a specific improvement, the power modes are identified directly from components of the circuit.

In another specific improvement, the separating into multiple power modes is accomplished using a sub-process comprising: building a power model for power consumption for the entire circuit; generating a power profile using the power model for the entire circuit; identifying homogenous regions in the generated power profile; and characterizing each of said homogenous regions as a power mode.

In a further specific improvement the power profile is a two dimensional graph of actual power dissipated versus power estimated by the macro model for the entire circuit.

In a specific improvement, the power mode identification function is based on identifying a defining condition each for each of said power modes.

In a further specific improvement, the defining condition for a power mode is created by identifying a set of conditions that are unique to a power mode and composition of the set of identified conditions.

Another aspect of the disclosed techniques is a method of estimating power dissipation in an RTL circuit, the method comprising: obtaining an input vector; executing a power identification function with the input vector as an input; selecting one of a plurality of power models based on the results of the execution of the power identification function; and estimating power dissipation based on selected power model.

III. BRIEF DESCRIPTION OF THE DRAWINGS

The above objectives and advantages of the present invention will become more apparent by describing in detail preferred embodiments thereof with reference to the attached drawings in which.

Figure 1:
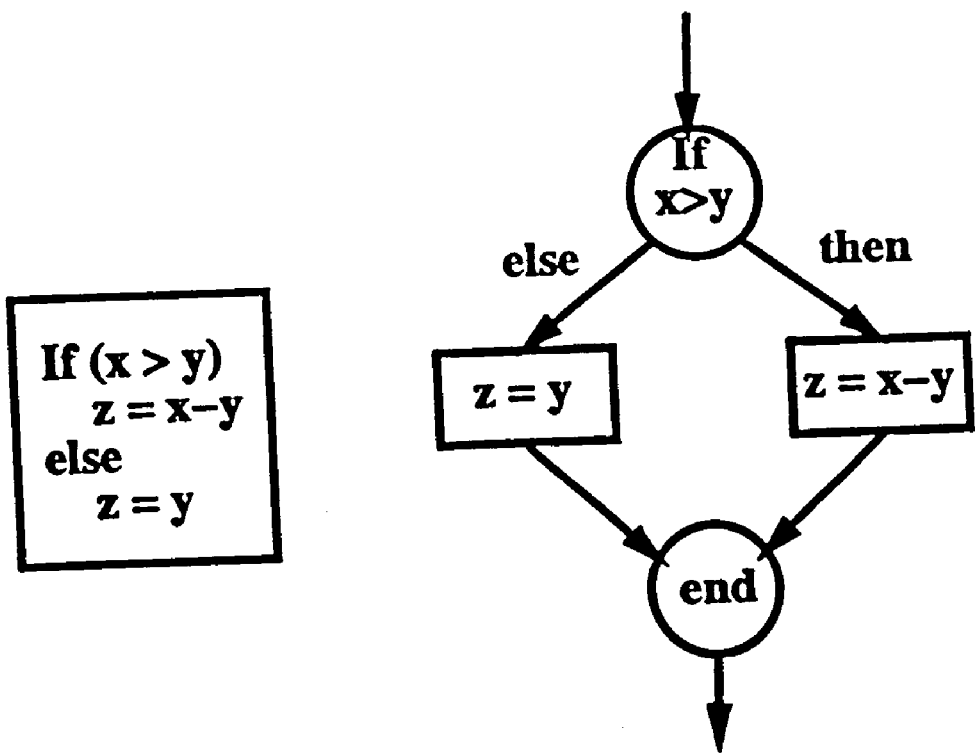
FIG. 1 shows a behavioral description of an example circuit.
Figure 3:
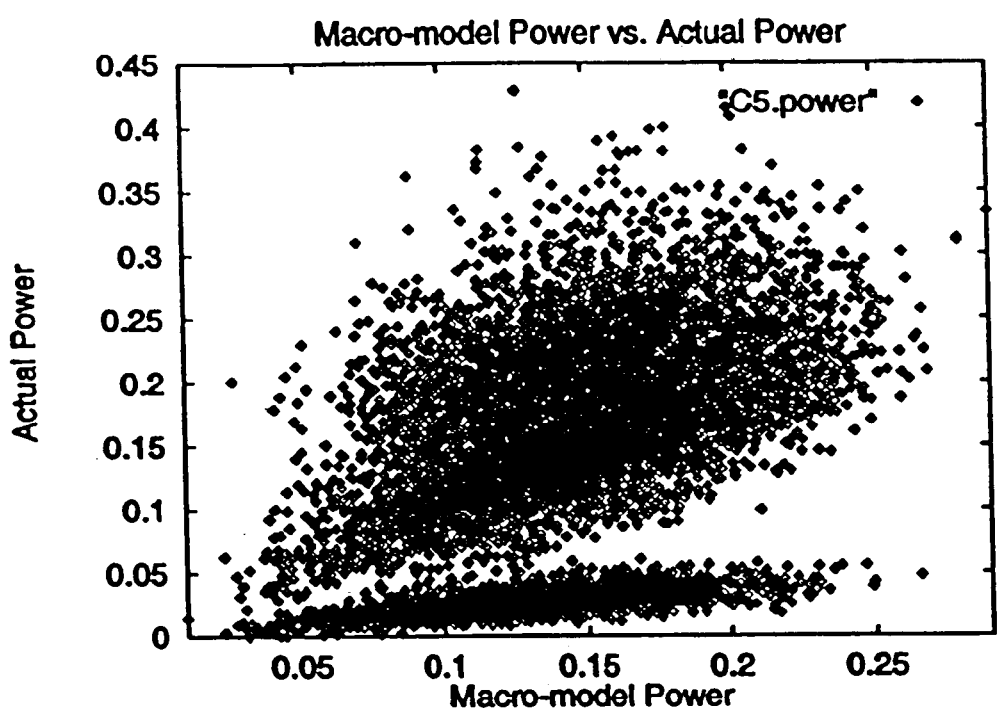

FIG. 3 Two modes of operation of the example of FIG. 1.

Figure 4:
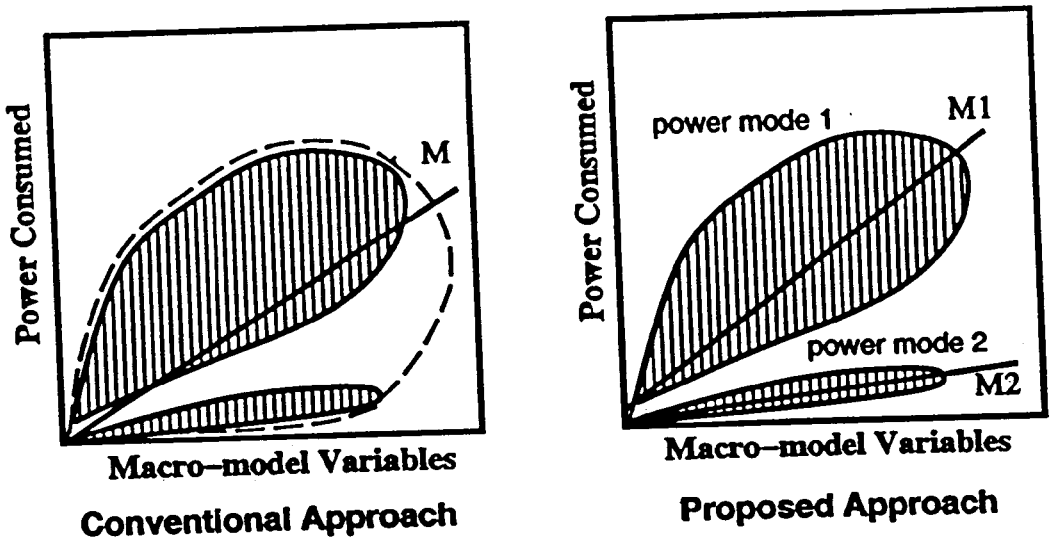

FIG. 4 shows a conventional and the disclosed macro-model for comparison.

Figure 5:
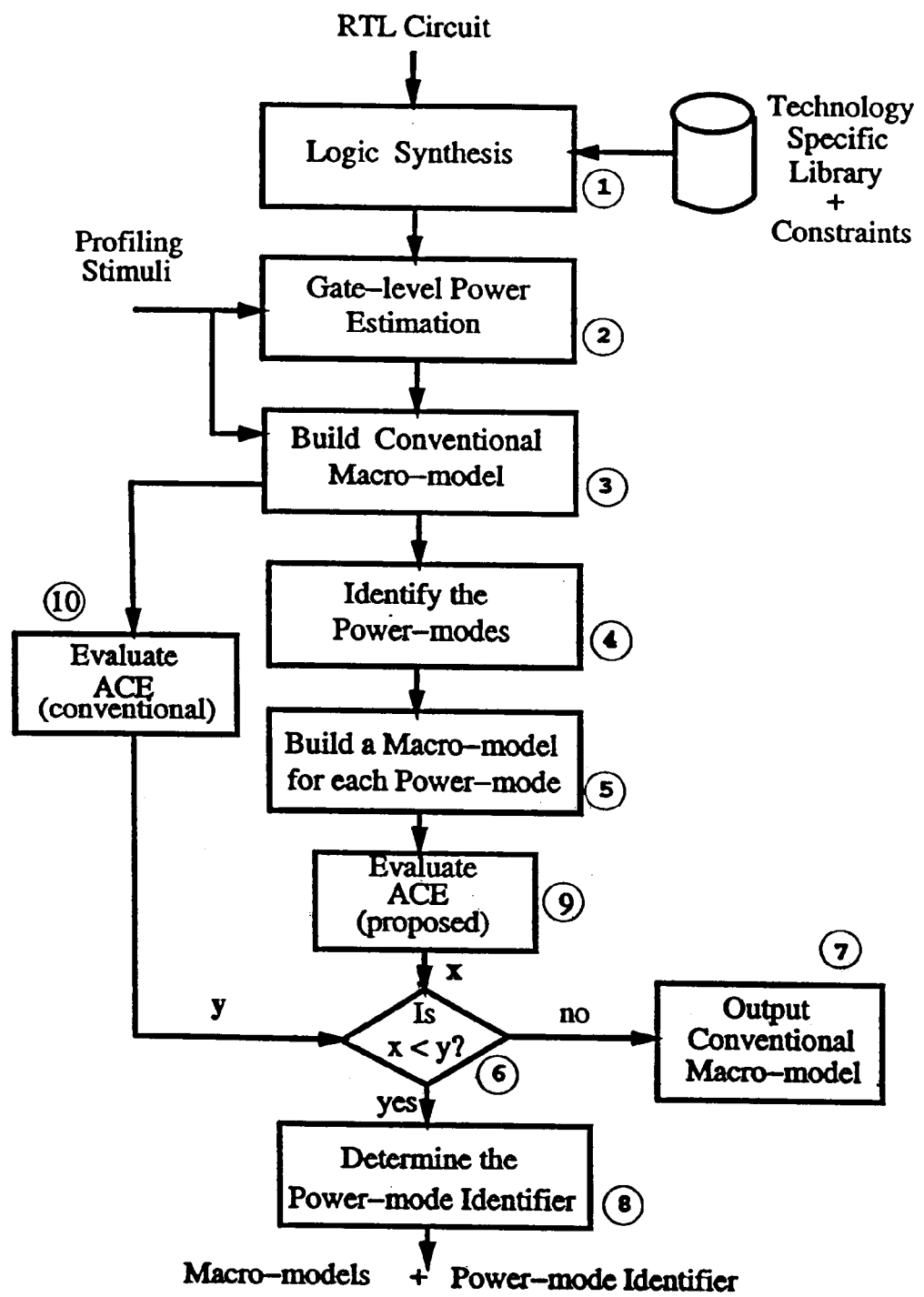

FIG. 5 shows an overview of an embodiment using RTL circuits for the disclosed power macro-modeling technique.

Figure 6:
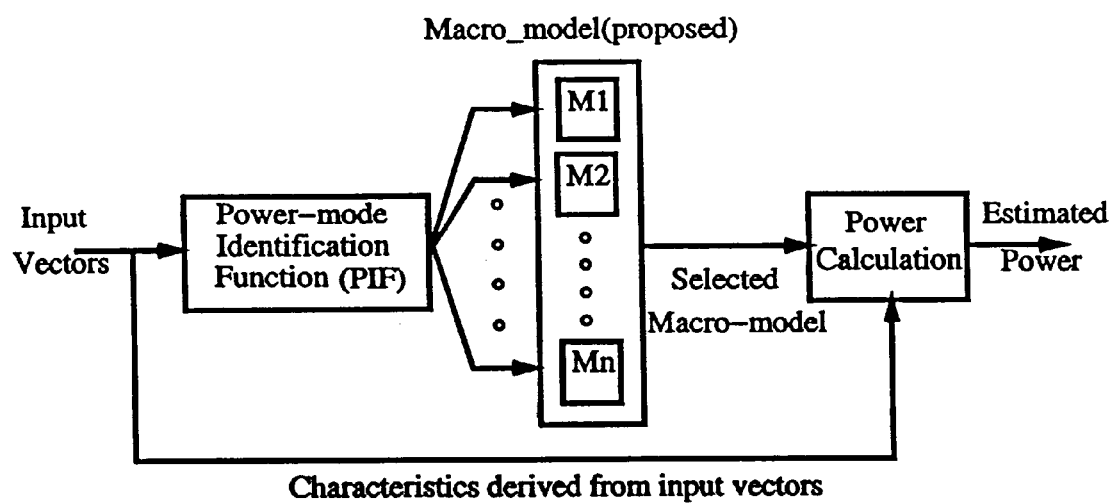

FIG. 6 shows power estimation using an example RTL circuit and an embodiment of the disclosed power modeling technique.

FIG. 7 depicts the line sweep algorithm.

Figure 8:
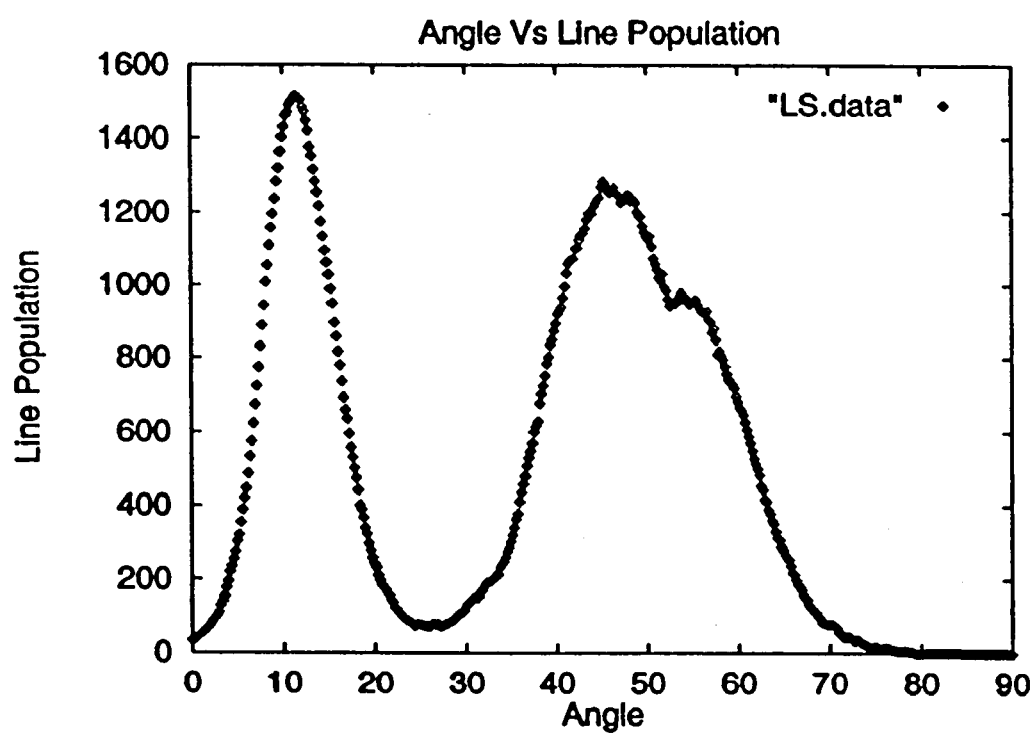

FIG. 8 shows the results of the line sweep algorithm on an example circuit.

FIG. 9 shows a strength classification algorithm.

Figure 10:
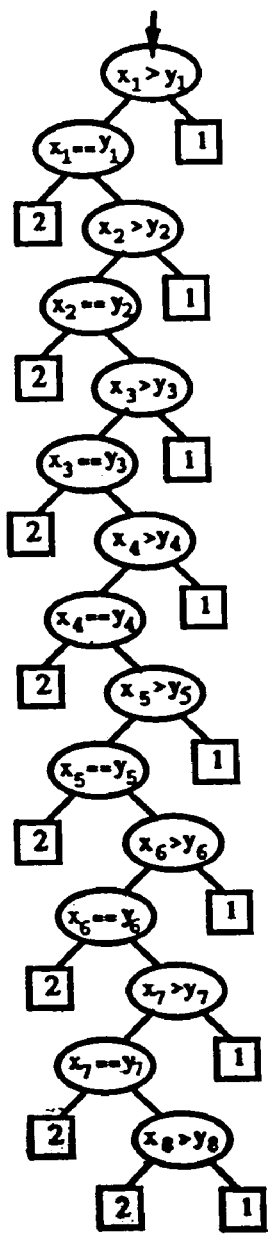

FIG. 10 shows an example of a power mode identification tree.

FIG. 11 shows Table 1 that describes the characteristics of the experimental circuits selected.

FIG. 12 shows Table 2 that describes the results of experimental analysis.

IV. DETAILED DESCRIPTION

The disclosed teaching provides novel techniques for the cycle-accurate power macro-modeling of complex circuit components. Illustrative examples are provided using RTL circuit. It should be clear that the disclosed teachings are not limited to RTL circuits and can be applied to any circuit regardless of the representation used.

It can be observed that circuit components (RTL components, in the illustrative examples) often exhibit significantly different "power behavior" for different regions of the input space. These regions are referred to as the power modes of the components, since the relationship between the power dissipated and the parameters (independent variables) varies appreciably from one region to the another. It can be seen that the use of area and performance optimized RTL components, including multi-functional units, ALUs, and functional units that perform complex operations, results in the presence of multiple power modes. Also the use of low-power design techniques such as operand isolation within the components themselves, causes this phenomenon of multiple power modes. Conventional techniques for cycle-accurate macro-modeling build a single macro-model to estimate power dissipation across all the power modes of a complex circuit (See [10, 11]). It can be shown that the large variance in power behavior from one power mode to another, significantly limits the estimation accuracy of conventional macro-models.

The disclose techniques addresses this problem by adopting an approach that includes the following:

1. Given a circuit component, its characterization vectors, and corresponding power data, the input space is partitioned into its constituent power modes.
2. Separate macro-models are constructed for each power mode (using existing macro-modeling techniques).
3. A classification function is constructed, which when the input trace to the component is provided, selects an appropriate power mode (and hence macro-model) for use in each cycle.

Step 3 is useful, because, the disclosed technique builds multiple macro-models (one for each power mode) for any given complex circuit. Hence, when applying the power macro-model, for any given input vector, it is useful to know which one of the macro-models is to be invoked for estimating the power dissipated. Conventional macro-modeling techniques do not have this step, since they build a single macro-model for the entire input space.

The disclosed techniques differ significantly in the manner in which the "power modes" are identified from some conventional techniques. First, as explained subsequently, power modes are identified directly from the power profile of a component, which makes it applicable with any basic macro-modeling approach. Second, as shown in the example presented in Section IV.A, for several RTL components, it may not be possible to separate out the primary inputs to the component into control and data inputs in the manner done in [10]. The control conditions that define the power modes of the component may be manifested as functions of the "data inputs", rather than as separate inputs.

IV.A. An Example Circuit Illustrating an Embodiment of the Disclosed Technique

In this section, some basic motivating factors that show the advantages of the disclosed techniques are illustrated using an example. The performances of the disclosed macro-modeling technique and the conventional cycle-accurate macro-modeling methods are compared using an example circuit. It can be seen that significant enhancement in power estimation accuracy can be obtained by the former.

Consider a circuit C5, which implements part of the commonly known greatest common divisor (GCD) algorithm [13]. It has two 8-bit inputs, x and y, and a 8-bit output, z. The behavioral description of circuit C5 and its CDFG are shown in FIG. 1.

Figure 2:
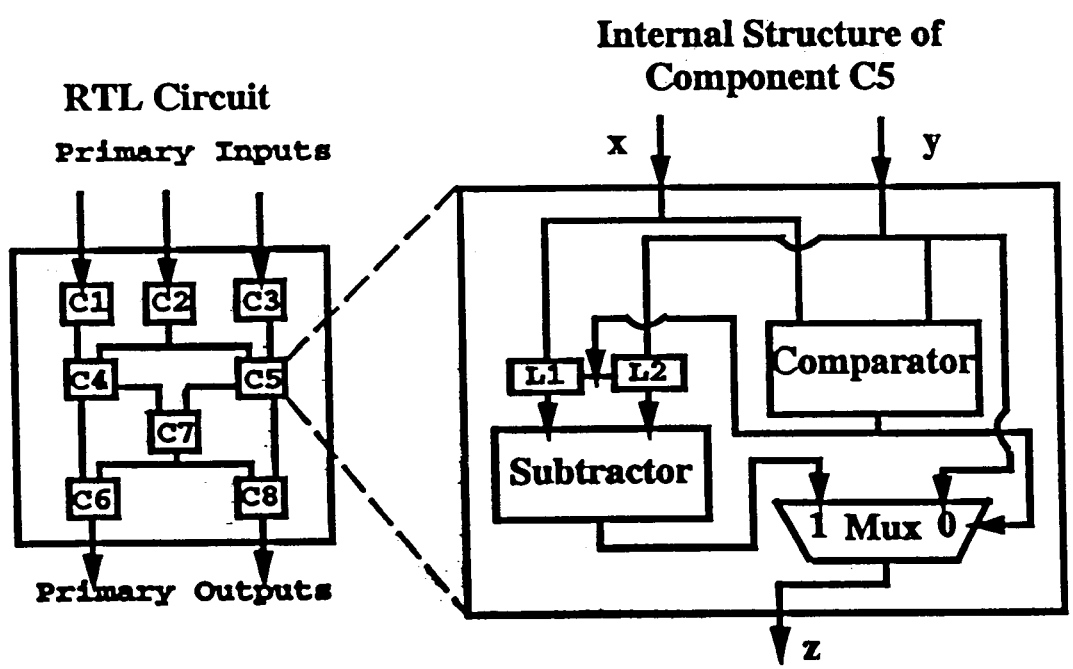
FIG. 2 shows an example of a complex circuit usage in an RTL core.

FIG. 2 shows an example usage of C5. On the left is an RTL circuit, which uses several complex circuits (including C5) as basic blocks for implementing its desired functionality (say, RSA security encryption, which needs GCD calculation). The right side shows the magnified high-level view of the internal structure of C5. Besides some generic performance optimizations, it uses a low-power design strategy called operand gating (for further explanation of operand gating, see [1]) enforced through the use of latches, L1 and L2. In the cycles where the subtracter is not doing useful computations, i.e., when z is less than or equal to y, the inputs to the subtracter are "frozen", i.e., the latches L1 and L2 are disabled, thereby preventing the new input values from entering the subtracter. The freezing of the inputs to the subtracter results in power saving, by eliminating unnecessary switching activity in the subtracter.

Initially, a conventional cycle-accurate macro-model using a large set of randomly generated vectors known as the profiling stimuli [10, 11] has been generated for comparison. This macro-model is referred to as macro-model$_{conventional}$. In order to study the power consumption behavior of C5, its power profile was plotted using the vectors of the profiling stimuli. The profile is a two dimensional graph of the actual power dissipated (Y-axis) as a function of the macro-model power estimate (X-axis). It is shown in FIG. 3. For every vector in the profiling stimuli, "actual power dissipated" is obtained from an accurate power simulator, and the "macro-model power estimate" is obtained by using the macro-model$_{conventional}$. The resulting plot unambiguously shows the presence of two homogeneous regions, i.e., clusters, each having a different power estimation characteristic. Different power estimation characteristics mean that for some of the points, the actual and the estimated power values scale with sufficient accuracy (exemplified by the points belonging to the upper cluster in FIG. 3). But, for the rest of the points, the power estimated (by the macro-model$_{conventional}$) is inaccurate by either being too optimistic (illustrated by the points belonging to the lower cluster in FIG. 3) or very pessimistic with respect to the actual power. Thus, the presence of clusters is an evidence of the fact that multiple relationships, between the power dissipated and the independent variables (macro-model parameters), exist in the input space of some circuits. As a corollary of this observation, it can be stated that the accuracy of estimation can be greatly enhanced by building separate macro-models to describe the unique relationships represented by the clusters. Thus, the number of macro-models built will be equal to the number of clusters in its power profile. Analysis of the points belonging to the clusters shows that the mean value of the actual power dissipated (of all the points in a cluster) varies significantly from one cluster to the other. This explains the inability of the macro-model$_{conventional}$ to accurately estimate the power over the entire input space. Because of this observation, the clusters are referred to as power modes of the circuit. FIG. 3 indicates that C5 has two power modes. The upper and the lower clusters (in FIG. 3) are said to be representative of "power mode 1" and "power mode 2" of the circuit C5, respectively.

The disclosed cycle-accurate macro-modeling techniques are then applied to the circuit C5. An automated algorithm is used to separate the points (corresponding to the vectors of the profiling stimuli) in the power profile, shown in FIG. 3, into non-overlapping sets, where each set contains points belonging to a distinct cluster of the plot (or power mode of the circuit). Corresponding to the two clusters in FIG. 3, two sets of vectors are present. A unique cycle-accurate macro-model is created for each of the vector sets. Any approach can be used to generate the macro-models and the disclosed technique is not limited to any specific way of generating a model. The two macro-models, thus created, are referred to as macro-model$_{proposed}$. This scenario is qualitatively illustrated in FIG. 4.

The plot on the left (in FIG. 4) shows the conventional macro-modeling approach. The line denoted by M is the macro-model$_{conventional}$. This technique does not distinguish between the two power modes and builds one macro-model (M) for the entire input space. This conceptual behavior is illustrated by the broken line, in the left plot of FIG. 4, which combines the distinct clusters into one region. By doing so, this macro-model$_{conventional}$ (M) is constrained to assume the existence of some points which do not exist in reality in the input space of the circuit. As a result of this, the macro-model$_{conventional}$ (M) grossly under-estimates or over-estimates the power consumed by some legitimate data points (which are representative of the input vectors).

The plot on the right shows the disclosed macro-modeling approach. The disclosed approach constructs separate macro-models, M1 and M2, for power mode 1 and power mode 2 respectively. The macro-models M1 and M2 are collectively known as macro-model$_{proposed}$. In the illustrative experiments, the macro-models (i.e., M, M1, M2) are depicted as linear functions of the independent variables. However, in general, any macro-modeling technique including non-linear functions, table-lookup, etc., can be used without deviating from the scope of the disclosed teaching.

Finally, a function that helps in deciding which one of the two macro-models (macro-model$_{proposed}$) M1 and M2, to use for any given input is required. This function is called as the power mode identification function (PIF). In order to construct the PIF, some sets of conditions (or properties) which are unique to the points in each cluster are required. The existence of a power mode can be linked to the satisfiability of the set of conditions endemic to it. The set of conditions corresponding to a power mode are concatenated, using the AND and OR operators, to get the defining condition of that power mode. By examining the points in the power modes (clusters in FIG. 3) of circuit C5, the following observations can be made:

1. A very large percentage (>98%) of the points in power mode 1 (further of the two clusters from the X-axis in FIG. 3) of circuit C5 uniquely satisfy the condition: x is greater than y. Thus, it can be concluded that X.$\overline{Y}$ is the defining condition of power mode 1 (X={x0 . . . x7} is the vector representing input x (FIG. 2). Y is defined in the same way and $\overline{Y}$ is the complement of Y).

2. All the points in power mode 2 (cluster nearer to the X-axis in FIG. 3) of circuit C5 uniquely satisfy the condition: x is less than or equal to y. Thus, we concur that $\overline{X \oplus Y}|\overline{X}.Y$ is the defining condition of power mode 2. Else, since there are only two power modes, we can also represent the defining condition of power mode 2 as $\overline{X.\overline{Y}}$.

The PIF of C5 is obtained from the defining conditions of power mode 1 and power mode 2. The PIF can be represented as an encoding function, the inputs to which are the input vectors. The function evaluates the defining conditions and outputs the power mode whose defining condition is asserted (at anytime, only one defining condition is asserted). In the case of circuit C5, the PIF is relatively simple because the power mode of any given input can be determined by evaluating only one defining condition (assertion implies the power mode corresponding to the condition and negation implies the existence of the other power mode).

In order to test the macro-models, a large set of vectors (different from the profiling stimuli) are generated and the macro-models (conventional and proposed) are used to estimate the power dissipated by those vectors in C5. In the disclosed scheme, given an input vector, the PIF is used to identify the power mode to which the input belongs. Then, the macro-model corresponding to the power mode identified is used to estimate the power dissipated by it. The Absolute Cycle-by-cycle Error (ACE) of macro-model$_{conventional}$ was found to be 1.304, and that of macro-modelproposed was observed to be 0.508. This shows that macro-model$_{proposed}$ is more accurate that macro-model$_{conventional}$, and improves the estimation accuracy by 61% for this illustrative example.

The above example indicates the potential of the power mode based macro-modeling technique in improving the estimation accuracy. The disclosed methodology, though applicable for all circuits, is especially suited for complex circuits where the existence of power modes is not readily apparent i.e., these circuits do not have explicit control inputs which hint at the possible existence of power modes. The power modes will become apparent when the power profile is plotted. This is especially true in scenarios where the complex circuit is embedded in some logic. The following section presents a more detailed description of the disclosed techniques.

IV.B. Illustration of an Overall Flow of an Embodiment of the Disclosed Technique The flowchart in FIG. 5 shows an embodiment of the proposed technique.

A macro-model is a function which parameterizes the power dissipated in terms of some variables which can be derived from the inputs applied. As indicated earlier, the macro-model itself can be built using any conventional methods. For example, analytical techniques [7, 8] or characterization-based techniques [9, 10, 11] can be used. Because of its greater accuracy, the present embodiment uses the characterization-based power macro-modeling approach. In this technique, the macro-model is built by using power dissipation information obtained from a lower level implementation. The inputs to a characterization-based macro-model building stage are a set of vectors and the actual power dissipated by them. The set of vectors, which are used to build the macro-model are referred to as the profiling stimuli.

The actual power values are obtained by observing the power dissipated in the gate-level implementation (of the input RTL circuit) by the vectors in the profiling stimuli (step 2 in FIG. 5). In the experiments, the input RTL circuit was mapped to NEC's CBC9VX technology library [17] using the CYBER synthesis framework [18]. In order to estimate the power dissipated by the vectors in the gate-level implementation of the circuit, NEC's in-house simulation-based gate-level cell-based power estimation tool [16] was used. It should be noted that the simulation tool has been calibrated and benchmarked within 10% of SPICE.

The cell-based power estimator incorporates several state-of-the-art gate-level power simulation techniques, including state-dependent power modeling, accurate glitch filtering using inertial delay models, etc. It is currently being used on ASIC designs for gate-level sign-off at NEC. The power models for the individual library cells used in cell-based power estimator were constructed using SPICE. Thus, it is believed that the power estimates given by the cell-based power estimator have a very fidelity to the actual power dissipation. The profiling stimuli and the power values are given as inputs to step 3 (FIG. 5), in which a macro-model is built using conventional techniques. The macro-model built in step 3 (FIG. 5) is referred to as macro-model$_{conventional}$. The accuracy of the macro-model$_{conventional}$ is determined by the measure known as ACE$_{conventional}$. In order to obtain ACE$_{conventional}$ (step 10 in FIG. 5), the estimates given by macro-model$_{conventional}$ are compared against the actual power values (obtained from the power simulation of the gate-level implementation).

The next operation is to identify the power modes (if any) in the operation of the circuit (step 4 in FIG. 5). In order to do this, the power profile of the circuit is generated by plotting the actual power dissipated (Y-axis) versus the macro-model power estimate (X-axis), for all the vectors in the profiling stimuli. The macro-model$_{conventional}$ is used to obtain the "macro-model power estimate" for all the vectors in the profiling stimuli. The presence of clearly demarcated clusters in the resulting plot implies the presence of power modes, where each power mode is an indication of the existence of a unique relationship between the actual power dissipated and the independent variables (macro-model parameters). The set of power modes is isomorphic with the clusters in the profile plot.

In order to separate the clusters i.e., group together the points (vector pairs) belonging to same cluster, an automated process known as the line sweep algorithm, described in Section IV.C, is used. In this algorithm, a line of increasing slope sweeps the profile, starting from the X-axis and ending at the Y-axis. In doing so, it outputs information pertaining to the boundaries of each cluster. The boundary information, output by the line sweep algorithm, is used to cleave the profiling stimuli into non-overlapping subsets, where each subset contains vector pairs belonging to a distinct cluster. Using conventional macro-modeling techniques, a macro-model is built for each power-mode by using its corresponding vector set and their power dissipation values (step 5). Since the points in the separated sets are in fact vector pairs, the power dissipated by them will be invariant, and thereby can be obtained from the power values obtained in the initial power simulation using the profiling stimuli. The macro-models built for the power modes are collectively referred to as macro-model$_{proposed}$. ACE$_{proposed}$ is representative of the accuracy of the estimates given by macro-model$_{proposed}$ (Step 9 in FIG. 5). ACE$_{proposed}$ is a function of the ACEs of the individual macro-models which make up macro-models$_{proposed}$ and the number of points in each power mode. The formula is provided in Section IV.C. If ACE$_{proposed}$ is less than ACE$_{conventional}$, indicating that the disclosed technique has better accuracy than the conventional method (step 6 in FIG. 5, x denotes ACE$_{proposed}$ and y denotes ACE$_{conventional}$), the algorithm proceeds to the next step of building the PIF (step 8 in FIG. 5). The proposed macro-modeling scheme terminates by outputting the macro-model$_{proposed}$ and the PIF. In case, in step 6 (FIG. 5), if x is greater than y, then the macro-modeling process is terminated and macro-model$_{conventional}$ is given as the output (step 7 in FIG. 5).

In order to formulate the PIF, the defining conditions of the power modes need to be determined. This is done by the strength classification algorithm. The inputs to this algorithm are the control conditions of the RTL circuit. The control conditions are obtained by taking permutations of all the "If-then" statements in the behavioral specification of the circuit. The "If-then" statements control the execution of the program, thereby determining which ALU operations occur. The power modes arise due to the significant variance in the aggregate power dissipation of the ALU operations in the possible execution paths. Since, the complex circuits are essentially building blocks for larger circuits, and not the end circuits by themselves, it can be assumed that the number of possible paths of execution is small. For any given cluster, the strength classification algorithm assigns the control condition, satisfied by the majority of the points in it, as the defining condition of that cluster. After the defining conditions of all the clusters are determined, the Boolean conditions representing them are abstracted to obtain the PIF for the circuit.

The usage of the disclosed macro-model is shown in FIG. 6. In FIG. 6, the blocks M$_1$, M$_2$, . . . , M$_n$, indicate the macro-models which make up macro-models$_{proposed}$ of the circuit under estimation (The circuit has n power modes of operation). Thus, given an input, the PIF is used to identify the power mode to which it belongs to. Then, the macro-model corresponding to the power mode output by the PIF is used to estimate the power dissipated by the input.

IV.C. Example Implementation of Individual Components

In this section, the implementation details of the constituent steps of an example implementation of the disclosed macro-modeling technique are discussed. This section is divided into four subsections: subsection IVC.1 describes the theory used for building the cycle-accurate macro-models (blocks 1, 2 and 3 in FIG. 5), subsection IVC.2 describes the process of evaluating the accuracy of the conventional and the proposed macro-models (blocks 9 and 10 in FIG. 5), subsection IVC.3 details the identification of the power modes (blocks 4 and 5 in FIG. 5) and, finally, subsection IVC.4 explains the construction of the power mode identification function (block 8 in FIG. 5).

1. Building Cycle-accurate Power Macro-models

The construction of the macro-model (step 3 in FIG. 5) can be implemented using a variety of techniques, such as, linear and non-linear statistical techniques, power sensitivities, tree-based regression etc. In the present example, the linear regression based approach [10, 11] is chosen, because construction and use of linear regression based macro-models is efficient, and the tools for building linear regression models are widely available [15]. The disclosed technique can incorporate any other cycle-accurate macromodeling technique with minimal and routine efforts.

The linear macro-model, used for the present example implementation, describes the power dissipated P, as a linear function of $X_1$, $X_2$, . . . , $X_n$, which are some characteristic variables derived from the inputs. The linear statistical relationship between the power dissipated and the variables can be expressed as.

$$P = \alpha_0 + \alpha_1 X_1 + \alpha_2 X_2 + \ldots + \alpha_n X_n + \theta$$

The terms ($\alpha_0$, $\alpha_1$, . . . , $\alpha_n$) are constants known as the regression coefficients of the macro-model. $\theta$ is a random quantity representative of the error of the fit. For any given input, $\theta$ is representative of the deviation in the power estimated by the macro-model from the actual power value dissipated.

2. Evaluating Power Macro-models

The quality of the macro-model built is evaluated by using a quantity known as Absolute Cycle-by-cycle Error (ACE). It is defined as the absolute value of the percentage error of the estimated power with respect to the actual power, summed over all the vectors in the profiling stimuli. This measure is given by:

$$ACE = 1/N \sum_{i=1}^{N} \left| \frac{P_{estm,i} - P_{obs,i}}{P_{obs,i}} \right|$$

where $P_{estm,i}$ is the power estimated by the macro-model for vector i, $P_{obs,i}$ is the actual power dissipated by vector i and N is the total number of vectors in the profiling stimuli. The value of ACE indicates how precisely the macro-model estimates the cycle-by-cycle power consumption of the circuit (higher values of ACE indicate lower estimation accuracies). The value of ACE$_{conventional}$ is obtained directly using the above formula. The value of ACE$_{proposed}$ which represents the accuracy of the proposed approach with multiple macro-models, is computed as follows. Consider a complex circuit that has S power modes. If $N_1$, $N_2$, . . . , $N_S$ are the number of vectors in the S power modes and if ACE$_1$, ACE$_2$, . . . , ACE$_S$ denote the ACEs of the corresponding macro-models built for the power modes, then the ACE$_{proposed}$ is defined as:

$$ACE_{proposed} = \frac{N_1 * ACE_1 + N_2 * ACE_2 + \ldots + N_S * ACE_S}{N_1 + N_2 + \ldots + N_S}$$

where $$N_1 + N_2 + \ldots N_S = N$$

(N is the total number of vectors in the profiling stimuli). If ACE$_{proposed}$ is less than the ACE$_{conventional}$, it means that the power mode conscious macro-modeling has improved the accuracy of estimation. Otherwise, the macro-model$_{conventional}$ is used for estimation. As borne out by the experimental results presented later, macro-model$_{proposed}$ proves to be a much more accurate estimator than macro-model$_{conventional}$.

3. Power Mode Analysis

The power mode analysis step consists of identifying the power modes (if any) of the circuit and separating the vectors (profiling stimuli) into different sets based on their power modes. Highly accurate clustering information can be obtained by plotting the actual power dissipated against the independent variables (macro-modeling parameters) that are used to build the macro-models. This plot would clearly reveal the dependence of power on input variables and the combinations thereof. If the macro-model is parameterized on N variables, then the power profile would be a N+1 dimensional plot (1 is due to the actual power values). However, identifying clusters in N±1 dimensions becomes computationally infeasible for even moderate values of N. Therefore, a trade-off between accuracy and computational efficiency is made by reducing the profile to two dimensions. In order to accomplish this trade-off, the power consumption reported by the gate- or transistor-level estimator is plotted against the value estimated by macro-model$_{conventional}$ for each vector pair in the profiling stimuli. For example, the plot for the component C5 shown in FIG. 2 was shown in FIG. 3.

In order to identify the clusters and separate them, the line sweep algorithm, whose pseudo-code is shown in FIG. 7 is used. A "sweep line" detects the clusters by sweeping the power profile plot, starting from the X-axis and stopping when it reaches the Y-axis (the angle between the line and the X-axis is incremented in steps of Δ starting from 0° until it reaches 90°). At each step, a quantity called line_popl is computed, which is the number of points on the line. When line_popl exceeds a user-specified threshold T$_{start}$ and the flag is not set, the start of a cluster is detected. The algorithm notes the starting value of the cluster (start_cluster) and the cluster number (num. cluster). It keeps moving in the detected cluster, until the cluster termination condition is satisfied. The termination condition is satisfied when line_popl falls below T$_{end}$. At termination, the boundary of the cluster is marked (end_cluster). The flag is reset and the cluster information CLUSTER(num_clstr, start_clstr end_clstr) is returned. Based on the angles start_cluster and end_cluster, returned by the algorithm, the vectors belonging to the corresponding cluster (num_cluster) are identified.

Any points that do not fall into any of the identified clusters at the end of the sweep process are assigned to the cluster nearest to them (based on Euclidean distance). The values of T$_{start}$ and T$_{end}$ are specified by the user, based on the point density in the clusters and the regions separating the clusters, respectively. Note that the algorithm presented above can be easily modified to also vary the line intercept in addition to the slope.

FIG. 8 shows the results of running the Line Sweep algorithm (FIG. 7) on the power profile of C5 (FIG. 3).

The plot gives the value of line population (FIG. 7) as the line sweeps the profile of circuit C5. The minimas in the plot (FIG. 8) indicate the separation between the clusters, i.e., the line population falls below T$_{end}$ (in FIG. 7) at the minimas. In FIG. 8, there are three minimas. The first and the third minimas are trivial, since they denote the start of power mode 1 and end of power mode 2, respectively. The minima of interest is the second one, which indicates the separation between power mode 1 and power mode 2. Analysis of the plot (FIG. 8) shows that the second minima occurs when the sweeping line make an angle of 26° with the X-axis, i.e., slope of 0.5. Examination of the power profile of C5 shows that the separation between the power modes, as given by the line sweep algorithm, is indeed accurate. In the experiment, the line was moved in the steps of (1/5)°, i.e., Δ in FIG. 7 was set to (1/5)°. For the profile of circuit C5, which has 9999 data points, the line sweep algorithm converged in 2.5 secs (on a SUN Ultra 1 machine having 256 MB of RAM).

4. Building Power Mode Identification Function

The construction the Power Mode Identification Function involves identifying conditions (called the defining conditions) that classify a given input vector to the component into one of the power modes. The defining conditions of the power modes are determined by using the strength classification algorithm shown in FIG. 9. The classification algorithm takes as inputs the power modes identified using the techniques presented in Section IVC.3, and a set of candidate conditions. It selects the defining condition for each power mode from them.

The candidate conditions are obtained by taking the different combinations of the "If-then-else" statements in the behavioral description of the RTL component being modeled. In other words, each control condition represents a specific combination of the "If-then" statements, necessary to follow a particular path of execution. Note that, since the complex components that are considered for modeling are not large RTL circuits in themselves (they are primitives used for constructing larger designs), and the control conditions are identified from the behavioral description of the components, the number of candidate conditions is limited in practice.

The classification algorithm assigns a control condition (s), as a defining condition(s) of a power mode, only if it (they) satisfies (satisfy) both the following properties, with respect to the points in that power mode:

1. Prop 1: A large fraction of the points that belong to the power mode satisfy the control condition.
2. Prop 2: The fraction of input vectors that satisfy the control condition but do not belong to the power mode is small.

In some cases, there may exist few control conditions, which do not satisfy Prop 1 and Prop 2 simultaneously, for any of the power modes. We refer to them as the residual conditions. A heuristic is used to assign each residual condition to the power mode, whose macro-model gives the least error of estimation with respect to the vectors satisfying the corresponding residual condition. In the heuristic, the macro-model$_{conv}$ is also included in the list of macro-models evaluated for each residual condition. The strength classification algorithm is described in the pseudo-code shown in FIG. 9.

The defining conditions are represented as a set of Boolean conditions. The PIF is basically an encoding function. The PIF takes a vector pair as its input. It then evaluates all the defining conditions using the vector pair as the input. It outputs the power mode whose defining condition is asserted. At anytime, only one defining condition is asserted. The results reveal that this classification works with sufficient accuracy. It should be mentioned that there do exist some cases where the input is assigned to the wrong power mode. This is due to the approximations made by the classification algorithm (FIG. 9). But the error in estimation, due to the incorrect predictions of the power mode, is outweighed by the gain in accuracy obtained by the correct classification in majority of the cases.

Since the macro-model used in the illustrative example is cycle-accurate, the PIF is invoked in every cycle of operation. This implies that the evaluation of PIF has to be fast, in order to avoid imposing a performance penalty. In order to achieve this goal, the PIF is represented as a binary tree structure known as the power mode identification tree (PIT). The internal nodes of the PIT are Boolean conditions derived from the PIF and the leaf nodes are the power modes. The PIT is traversed using the input vectors as arguments to the Boolean conditions at the nodes. Depending on whether the result of a node Boolean condition is true or false, the tree will branch right or left, to another node, respectively. This process continues until a leaf node is reached. The power mode denoted by the leaf node is the power mode to which the given input belongs. The macro-model corresponding to that power mode is used to estimate the power dissipated. Since the PIT is an efficient data structure, the performance overhead is minimal. The timing information is presented in the results section to illustrate the computational efficiency obtained by the PIT, as opposed to representing the PIF as a set of Boolean conditions.

In to order to build the PIT, the PIF needs to be determined. The formulation of the PIF is illustrated for C5 (the example circuit shown in FIG. 2). C5 has two 8-bit inputs, x and y. Its power profile showed the existence of two power modes. It has two control conditions: x greater than y (say, cntrlcond-1) and x less than or equal to y (say. cntrlcond-2). Through strength classification, it is determined that cntrlcond-1 is the defining condition of power mode 1 and cntrlcond-2 is that of power mode 2. Let $(x_1, x_2, x_3, x_4, x_5, x_6, x_7, x_8)$ denote the bit positions of x, with $x_1$ and x8 denoting the MSB and LSB respectively. Input y can be defined in a similar manner. The defining condition of the power mode 1 of C5 is the OR of the following Boolean conditions (assuming x and y represent unsigned integers):

$$\{x_1 > y_1\}$$

$$\{x1 == Y_1\} \&\& \{x_2 > y_2\}$$

$$\ldots$$

$$\{X_1 == y_1\} \&\& \{x_2 == y_2\} \&\& \{x_3 == y_3\} \&\& \{x_4 == y_4\} \&\& \{x_5 == y_5\} \&\& \{x_6 == y_6\} \&\& \{x_7 == y_7\} \&\& \{x_8 > y_8\}$$

If any given input vector to component C5 satisfies at least one of the above Boolean equations, then C5 is said to operate in power mode 1. In a similar fashion, the defining condition of power mode 2 of circuit C5 can be represented. C5 has only two power modes, therefore, the task of formulating the PIF becomes trivial. For example, consider the defining condition of power mode 1. Assertion of this condition implies the existence of power mode 1 and the negation automatically implies the existence of power mode 2. Therefore, the PIF of circuit C5 can be made equal to the defining condition of power mode 1. The same is not true, if there exist three (or more) power modes. The next step consists of converting the PIF into a PIT. At present this step has not been automated. The PIT of circuit C5 is shown in FIG. 10.

In FIG. 10, the nodes (ovals) contain the Boolean conditions and the leaf nodes (squares) rep-resent the power modes. For example, suppose the inputs given to C5 are: x={11010101} and y={01011010}. The first node of the PIT (FIG. 10) results in a true condition, thereby the tree will branch to the right. The right child is a leaf node containing 1. This shows that the given inputs belong to power mode 1 of C5. Subsequently, the macro-model corresponding to that power mode can be used for estimating the power consumed.

IV.D. Experimental Results

In this section, the results of an example implementation of the disclosed cycle-accurate macro-modeling technique on different example complex RTL components are presented.

In order to test the disclosed techniques, complex components (C5, . . . , C11) are selected, which are constituents of larger industrial designs synthesized using the CYBER synthesis framework [18]. Table 1 (shown in FIG. 11) describes the characteristics of the experimental circuits selected. Each circuit is a combination of several atomic RTL components. The second and third columns specify the number of inputs (I) and outputs (O) respectively. The fourth column gives the bit-width (BW) of the circuit inputs. The last column specifies the atomic components which constitute the circuit: comparator (Comp), 2-to-1 multiplexer (Mux), subtracter (Sub), adder (Add), multiplier (Mult), bit-vector AND (And), bit-vector OR (Or), and Latches.

For each of the 7 circuits, macro-models are built using the disclosed techniques, which involve identifying the power modes, building multiple macro-models, and constructing the power mode identification function. For the purpose of building the macro-models, the experimental circuits are mapped to the CBC9VX technology library [17], which is a 0.35$\mu$ gate-array based technology. The mapping was done using the CYBER synthesis tool [18] For building the macro-models, a set of 10000 vectors was used as the profiling stimuli. For the purpose of comparison, the macro-model$_{conventional}$ was also built for all the circuits. Then, an independent set of 10000 vectors are generated and used to simulate all the 7 circuits. For each circuit, the following three quantities are measured for each vector: the actual power dissipated (estimated using the NEC OpenCAD cell-based power estimator [16]), the power value estimated by macro-model$_{conventional}$, and the power estimated by macro-model$_{proposed}$. By substituting these three quantities in the formula for Absolute Cycle-by-cycle Error (ACE), the estimation error of the macro-model model$_{conventional}$ and the macro-model$_{proposed}$ are computed for each circuit. The results of this analysis are shown in Table 2 (shown in FIG. 12). The first column gives the circuit name. The second column gives the error in the estimates of macro-model model$_{conventional}$ (shown as Error(conv)). The third column specifies the estimation error of macro-model$_{proposed}$ (shown as Error(prop)). The last column gives the improvement in estimation accuracy obtained by our technique (shown as Imprv).

In order to obtain the values in the second and the third columns, the power estimates given by the macro-models (conventional and proposed) are compared against the power estimates given by the gate-level cell-based power estimator [16]. It is imperative to mention that the cell-based power estimator was calibrated with and bench-marked within 10% of SPICE. As mentioned before, it incorporates several state-of-the-art gate-level power simulation techniques, including state-dependent power modeling, accurate glitch filtering using inertial delay models etc. It is currently being used on ASIC designs for gate-level sign-off at NEC. The power models for the individual library cells used in cell-based power estimator were constructed using SPICE. Thus, it is believed that the power values given out by the cell-based power estimator are a reasonable reference point to compare the values given by RTL power estimation.

The results indicated that the disclosed technique significantly improves the accuracy of cycle-by-cycle power estimation compared to conventional macro-models (the improvements were as high as 90.56%, while the average improvement was 50%). The performance penalty incurred by our technique is also examined. The overhead is largely due to the invoking of the power mode identification function (PIF) at every cycle of operation. This performance penalty can be greatly reduced if the PIF is represented in an intelligent manner. It is observed that the Boolean equations representing the PIF can be easily converted to an efficient tree data structure. As already mentioned, this tree implementation is referred to as the power mode identification tree (PIT). In order to illustrate the performance enhancement obtained by using PIT, the PIF is modeled in two ways: as Boolean equations (naive approach), and as the power mode identification tree (PIT). We then evaluated the proposed (of the 7 experimental circuits), for the same set of vectors, using both the forms of PIF: naive and PIT (on a SUN Ultra 1 machine having 256 MB of RAM). For simulation runs involving 10000 vectors, naive approach placed an average overhead of 20.7 seconds compared to the conventional approach, whereas, the PIT model imposed an average overhead of only 6.04 seconds. This is a speed-up of more than 3× over the naive approach for power mode identification. For example, in the case of C7, the estimation with the conventional macro-model took 13.95 seconds, whereas, the estimation using the proposed macro-model, in which the PIF was modeled as PIT, took 20.2 seconds. In the same example, if the PIF was modeled as plain Boolean equations (naive approach), the estimation took in the excess of 40 seconds. These observations exemplify the relevance and importance of using PIT for power mode identification.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method of creating models for power estimation of a circuit comprising:
    a) generating an input space for the circuit;
    b) separating the input space into multiple power modes corresponding to regions that display similar power behavior;
    c) generating separate power models for each of said multiple power modes; and
    d) creating a power mode identification function that selects an appropriate power model from the separate power models based on the present and past values of inputs to the circuit.

2. The method of claim 1 wherein said power modes are identified directly from components of the circuit.

3. The method of claim 1 wherein said separating into multiple power modes is accomplished using a sub-process comprising:
    i) building a power model for power consumption for the entire circuit;
    ii) generating a power profile using the power model for the entire circuit;
    iii) identifying homogenous regions in the generated power profile; and
    iv) characterizing each of said homogenous regions as a power mode.

4. The method of claim 3 wherein said power profile is a two dimensional graph of actual power dissipated versus power estimated by a macro model for the entire circuit.

5. The method of claim 1 wherein the power mode identification function is based on identifying a defining condition each for each of said power modes.

6. The method of claim 5, wherein the defining condition for a power mode is created by identifying a set of conditions that are unique to a power mode and composition of the set of identified conditions.

7. A method of estimating power dissipation in an RTL circuit, the method comprising:
    a) obtaining an input vector;
    b) executing a power identification function with the input vector as an input;
    c) selecting one of a plurality of power models based on the results of the execution of the power identification function; and
    d) estimating power dissipation based on selected power model.

* * * * *